Jan. 18, 1966 T. G. STEHNEY 3,230,429
INTEGRATED TRANSISTOR DIODE AND RESISTANCE
SEMICONDUCTOR NETWORK
Filed Jan. 9, 1962

WITNESSES:
Bernard R. Giegucz
Gordon H. Telfer

INVENTORS
Thomas G. Stehney
BY
Frederick Shapoe
ATTORNEY

United States Patent Office 3,230,429
Patented Jan. 18, 1966

3,230,429
INTEGRATED TRANSISTOR, DIODE AND RESISTANCE SEMICONDUCTOR NETWORK

Thomas G. Stehney, Rillton, Pa., assignor to Westinghouse Electric Corporation, East Pittsburgh, Pa., a corporation of Pennsylvania Filed Jan. 9, 1962, Ser. No. 165,076
6 Claims. (Cl. 317—235)

This invention realtes generally to semiconductor transistor devices.

The conventional transistor with two PN junctions is generally not symmetrical because the two junctions are intentionally designed to have different characteristics. For example, efficient injection of carriers across the emitter junction is necessary for a high gain device. The usual emitter junction formed by alloy fusion is not subsequently cleaned up by etching or the like because the gain is thus deteriorated. However, the collector junction is designed and constructed to withstand a substantial reverse bias thereacross since that is its usual operating condition. Therefore, the collector junction is subjected to a cleaning which gives it a higher breakdown voltage. Consequently, the voltage at which voltage breakdown occurs at the emitter and collector junctions is usually quite different. For example, in power transistors of a type which is currently common, the collector junction breakdown voltage exceeds about 100 volts while the emitter junction has a breakdown voltage of only about 20 volts.

When the bias potential is applied across a transistor the desired condition is to apply a forward bias across the emitter junction and a reverse bias across the collector junction. This may conveniently be done by a single D.C. potential source having one terminal connected to the emitter region of the transistor and the other terminal to the collector region. As a result in the difference in breakdown characteristics of the two junctions which was mentioned above, it is essential that the transistor be connected across the potential source with the proper polarity or else there is danger of voltage breakdown of the emitter junction and permanent destruction of the device. This results from the fact that the appiled bias potential often exceeds the breakdown voltage of the emitter junction while it does not, fo course, exceed the breakdown voltage of the collector junction. Through mistake, incorrect bias polarity is often applied in practice with the result that damage to the transistor results.

Another prevalent feature of conventional transistors, particularly high gain transistors which have a high alpha at relatively low emitter current levels, is that the voltage drop across the collector and emitter with the base open ($V_{CEO}$) does not reach a constant level as rapidly as is desired but rather requires appreciable current before the saturation voltage is reached. The effect is that at zero applied signal the device may be producing a substantial output current which is generally undesirable.

It is therefore an object of the present invention to provide a transistor device having built in protection against damage due to the bias potential being applied with the wrong polarity.

Another object is to provide a transistor device having an improved $V_{CEO}$ rating.

Another object is to provide by a single inexpensive modification of a conventional transistor both protection for the transistor against improperly applied bias potential and an improved $V_{CEO}$ rating.

Another object is to provide the foregoing improvements in a well known type of power transistor device.

In accordance with this invention a transistor device is provided having a structure which includes a non-rectifying contact joining a small portion of the emitter to the base region which thus provides a protecting diode across the device and also provides a high ohmic resistance between the emitter and the base contact.

The shorting out of a portion of the emitter junction was generally undesirable in the prior art because the gain of the device is thereby decreased. However, it has been found that a sufficient shorting contact can be provided to achieve the advantages of the present invention while having only a negligible effect on the gain.

The above referred to "protecting diode" is provided by the collector to base junction which takes the voltage drop if a bias potential of incorrect polarity is applied since it will be in the conductive state and provide a current path not requiring traversal of the emitter junction.

The high resistance between the base contact and the emitter which exists in the base region has the effect of increasing the $V_{CEO}$ rating of the device because of the reduction of leakage current at zero applied signal.

The invention has been found to be particularly suitable and convenient to fabricate when applied to the type of power transistor wherein the emitter is an alloyed region on the surface of the base region and is at least partially surrounded by a base contact or base contacts. A common form of this device is that in which the emitter is a dot and the base is a surrounding ring. An interdigitated structure of multiple rings may be provided with an external bridge connection to the bases or the emitters. Other interdigitated forms include that in which the base and emitter are in a plurality of parallel alternately disposed strips and that in which the base and emitter are interleaved comb shaped members.

The features of the present invention which are believed to be novel are set forth with particularity in the appended claims. The present invention, both as to its structure and operation, together with the above mentioned and further objects and advantages thereof, may best be understood by reference to the following description, taken in connection with the accompanying drawings, in which:

Figures 1, 2, 3, 4:
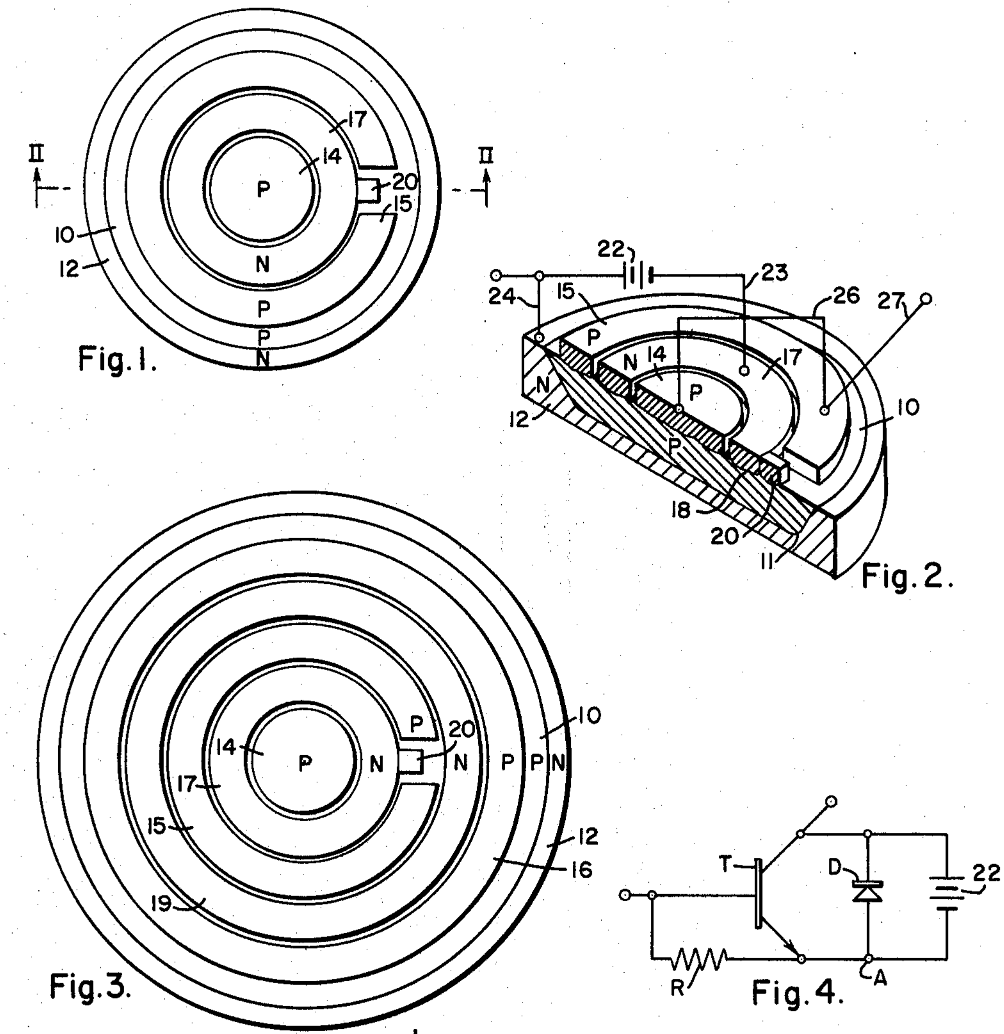
FIGURE 1 is a view of the surface of a transistor device made in accordance with the present invention.
FIG. 2 is a sectional perspective view taken along the line II—II in FIGURE 1 and includes a schematic showing of leads on the device and a bias potential source.
FIG. 3 shows a surface of a transistor device in another embodiment.
FIG. 4 shows an approximate equivalent circuit of a device in accordance with the present invention.

Referring to FIGURES 1 and 2 there is shown a power transistor of a type generally known but which has been modified in accordance with this invention. It is to be understood that the semiconductivity type of the regions as shown is merely by way of example and that P-N-P structures are suitable as well as N-P-N structures.

The structure includes a body semiconductive material 10 including sufficient impurities to give it P-type semiconductivity. The semiconductive body 10 is a thin circular wafer having opposed major surfaces. An alloyed region 12 of N-type semiconductivity is fused over the entire lower surface and around the edges of the wafer 10. This forms a P-N junction 11 with the wafer 10 and serves as the collector region of the device.

On the upper surface there are fused first and second base contacts 14 and 15 making ohmic contact to the wafer 10 and a fused emitter 17 contact making rectifying contact to the wafer. In this particular configuration the first base contact 14 is a circular element disposed in the center of the surface and is completely surrounded by the ring-shaped emitter contact 17 while the second base contact 15 surrounds the emitter contact except for a small gap therein. The emitter contact 17 contains N-type impurities and forms a junction 18 with the wafer which serves as the emitter-base junction.

As thus far described, the device is substantially like conventional power transistors. However, in addition to the foregoing elements there is fused on the upper surface of the device a shorting contact 20 which shorts out a small portion of the emitter-base junction 18. That is, the shorting contact 20 makes ohmic contact to both the emitter ring 17 and the base region (comprised of the bulk material 10) thus providing a non-rectifying current path which is electrically in parallel with the emitter-base junction 18. Because of its small size, the shorting contact 20 draws limited current when the emitter junction is forward biased and thus does not nullify the rectifying characteristics of the emitter junction which are necessary for transistor operation.

In FIGURE 2 the leads indicate the usual manner of interconnecting the elements of the device. By an external D.C. potential source 22 which has its negative terminal connected to the emitter ring 17 by a first lead 23 and its positive terminal connected to the collector region 12 by a second lead 24, a forward bias is applied across the emitter-base junction 18 and a reverse bias is applied across the collector-base junction 11. The two base contacts 14 and 15 are interconnected by conductive means such as a lead 26 with another lead 27 extending from the device which may be used for the application of a signal which would be amplified in the device and derived from the collector region.

FIGURE 4 shows the approximate equivalent circuit of the device of FIGURE 2 including the bias potential source 22. In addition to an N-P-N transistor T as would be provided conventionally, there is a diode D which is connected across the emitter and collector regions of the transistor in parallel with the applied bias potential. There is also a resistance R in parallel with the emitter-base junction. Both the diode D and the resistance R are brought about merely by the modification of applying the shorting contact 20 is shown.

It will be noted that the shorting contact 20 corresponds substantially to point A of FIGURE 4. As in conventional devices one electrical path is through the emitter 17, the emitter junction 18, the base region 10, the collector junction 11, the collector region 12 and back through the bias potential source 22. In accordance with this invention, however, further paths are provided in that there is now one from the shorting contact 20 bypassing the emitter junction 18 and going directly through the base region 10 to the collector junction 11 and the collector 12. This provides the diode D shown. Also, there is a resistive path from the shorting contact 20 through the bulk semiconductive material to the base contact 15 which provides the resistance R shown.

As shown in FIGURE 4 the polarity of the bias potential source 22 is correct in order to reverse bias the collector junction 11 and forward bias the emitter junction 18. Also, the diode D is in a reverse bias condition and small current will flow through it so that it will not substantially affect transistor operation. But if the polarity of the bias potential source 22 is reversed from that shown, damage to the transistor T as a result of breakdown of the emitter junction 18 is avoided because the diode D is forward biased and provides a current path with a low voltage drop so that the voltage across the emitter junction 18 does not exceed breakdown.

Therefore, the structure has an inherent self-protecting feature which avoids any problem resulting from incorrect application of the bias potential. It should be noted that to connect a diode across the transistor externally would be both very expensive and cumbersome while here the structure is only slightly modified without appreciable additional expense.

Figure 5:
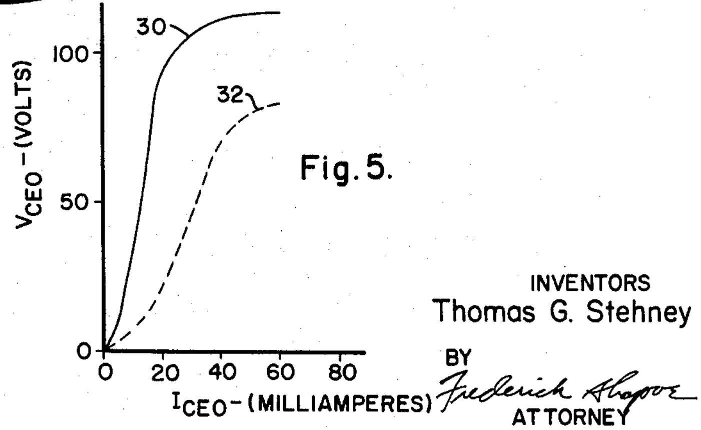
FIG. 5 shows curves of voltage against current in order to air in explaining the advantages of the invention.

The resistance between the emitter and the base improves the $V_{CEO}$ rating of the device which is very important in high gain units since the voltage-current characteristic is otherwise very gradual. As shown in FIGURE 5 wherein the voltage across the collector and emitter with the base open ($V_{CEO}$) is plotted against the collector current, it is seen by the solid line 30 that the characteristic rises steeply and levels off at a relatively constant value at low currents. By the dotted line 32, however, is shown a characteristic of previous power transistors showing a more gradually increasing characteristic which is undesirable because it indicates that larger currents are drawn at low voltages.

As a specific example of a device in accordance with this invention, like that shown in FIGURES 1 and 2, a silicon wafer 10 may be obtained by well known techniques doped with a suitable impurity to resistivity of about 50 to 150 ohms centimeters. Boron is a suitable P-type impurity for this purpose. A suitable wafer may have a diameter of about 0.463 inch and thickness of about 0.0038 inch. The base contacts 14 and 15 and the emitter contact 17 are dimensioned so as to fully utilize the surface of the semiconductive wafer with a spacing between contacts of about 5 to 10 mils. The base electrodes may be of an alloy of gold with about 0.3% by weight of boron. The collector and emitter contacts 12 and 17 have a composition of gold with about 0.6% by weight of antimony to provide an N-type regrown region upon fusion. The shorting contact 20 is also a P-type alloy, that is, it may have a composition of gold with about 0.3% boron. The size of the shorting contact 20 may be about 30 mils by 30 mils. The contacts were fused to the silicon wafer by heating the same under pressure at a temperature of about 700° C. for about two minutes. Then, leads may be applied to the structure in a conventional manner.

When the p-type alloy for the shorting contact 20 and the n-type alloy for the emitter 17 are fused, the impurities segregate into the semiconductor material and result in impurity doped regrown regions while a layer of neutral gold-silicon alloy extends over and contacts both the impurity doped regions.

It will be apparent that other semiconductor materials, dopants and fabrication techniques may be employed to achieve devices in accordance with this invention.

FIGURE 3 shows a device similar to the of FIGURES 1 and 2 but with an additional emitter ring 19 surrounded by an additional base contact 16 to provide improved characteristics in accordance with known power transistor techinques. In use all the emitter rings 17 and 19 are connected together to provide, in effect, a single emitter region which is meant to be included in the use of the term "emitter" in the appended claims unless the contrary plainly appears from the context. It will be realized that the position of the shorting contact 20 may be shorted to either of the emitter contacts 17 and 19 since they are externally connected together.

While the present invention has been shown and described in certain forms only, it will be obvious to those skilled in the art that it is not so limited but is susceptible to various changes and modifications without departing from the spirit and scope thereof.

I claim as my invention:

1. A transistor structure comprising: emitter, base and collector regions, said emitter and said collector each forming a rectifying junction with said base, a first contact making ohmic contact to said base region; a second contact, spaced from said first contact, disposed in ohmic contact with both said emitter region and a small portion of said base region to short out a small portion of the junction between said base and said emitter so that a portion of the junction between said base and said collector acts as a diode connected between said emitter and said collector, and an electrical lead attached to each of said first and second contacts; said first contact including at least a substantially annular metal member having a gap therein, said second contact including at least a portion positioned within said gap in said first contact.

2. A transistor structure comprising: emitter, base and collector regions, said emitter and said collector forming first and second rectifying junctions with said base; first ohmic contact means in contact with a portion of said base and with a portion of said emitter to short out a portion of the junction between said emitter and said base and to provide the electronic equivalent of a diode connected between said emitter and said collector; second ohmic contact means in contact with a portion of said base spaced from said first ohmic contact means to provide substantial resistance therebetween; each of said first and second ohmic contact means having an electrical lead attached thereto; said second ohmic contact means including at least a substantially annular metal member having a gap therein, said first ohmic contact means including at least a portion positioned within the said gap in said second ohmic contact means.

3. A transistor structure comprising: emitter, base and collector regions, said emitter and said collector forming first and second p-n junctions with said base at least one base contact on said base region; an ohmic contact on said base region also making contact with said emitter and spaced from said at least one base contact and shorting out a small portion of the junction between said emitter and said base so that a portion of the junction between said collector and said base acts as a diode connected between said emitter and said collector and a portion of said base between said shorting contact and said base contact acts as a resistance electrically in parallel with the junction between said emitter and said base; an electrical lead connected to said at least one base contact and another electrical lead connected to said emitter; said base contact including at least a substantially annular metal member having a gap therein, said shorting contact including at least a portion positioned within said gap in said base contact.

4. A transistor structure comprising: emitter, base and collector regions, said emitter and said collector forming first and second p-n junctions with said base, said collector junction having an appreciably greater breakdown voltage than said emitter junction; at least one base contact on said base region; lead members connected to each of said emitter, said collector and said base contact; a bias potential source connected between said lead members on said collector and said emitter; and an ohmic contact on said base region making contact with said emitter and spaced from said at least one base contact to short out a portion of the junction between said emitter and said base so that a portion of the junction between said collector and said base acts as a protective diode connected between said emitter and said collector to protect the emitter-base junction from breaking down if said bias potential source is applied with the wrong polarity; said base contact including at least a substantially annular metal member having a gap therein, said shorting contact including at least a portion positioned within said gap in said base contact.

5. A transistor device having built in protection against damage due to bias potential being applied with the wrong polarity and, also, having improved characteristics at low signal levels, said device comprising: three semiconductive regions including a base region having opposing major surfaces of large dimensions compared to the thickness of said base region; at least one emitter region fused to at least one portion, portions of a first of said major surfaces and forming at least one p-n emitter junction with said base region; a collector region fused to at least most of the other of said major surfaces and forming a p-n collector junction therewith; said collector junction being capable of withstanding an appreciably greater reverse voltage without breakdown than said at least one emitter region; at least one ohmic base contact fused to at least one portion of said first major surface; first lead means connected to all of said at least one emitter region; second lead means connected to said collector region; third lead means connected to all of said at least one base contact; an ohmic shorting contact fused to a portion of said first major surface and also fused to a portion of said at least one emitter region to provide a current path parallel to said emitter junction to prevent breakdown of said emitter junction in the event a reverse bias is inadvertently placed thereacross; said shorting contact spaced from said at least one base contact to provide appreciable resistance therebetween to minimize leakage current; said base contact including at least a substantially annular metal member having a gap therein, said shorting contact including at least a portion positioned within said gap in said base contact.

6. A transistor structure comprising: emitter, base and collector regions, the emitter and collector regions each forming a p-n junction with said base region; first electrical contact means contacting only said base region, second electrical contact means contacting only said collector region, third electrical contact means contacting said emitter region and a portion of said base region to short a portion of said p-n junction formed by said emitter; first, second and third electrical leads each attached to one of said first, second and third electrical contact means; said first electrical contact means comprises at least a substantially annular metal member having a gap therein and a circular metal member within said substantially annular metal member, said third electrical contact means comprises at least an annular metal member and a projection from the outside perimeter of said annular metal member, said projection extending into said gap of said substantially annular metal member of said first electrical contact means.

References Cited by the Examiner

UNITED STATES PATENTS

| | | | |
|---|---|---|---|
| 2,971,139 | 2/1961 | Noyce | 317—235 |
| 2,985,804 | 5/1961 | Buie | 317—235 |
| 2,993,154 | 7/1961 | Goldey | 317—235 |
| 3,060,327 | 10/1962 | Dacey | 317—235 |

DAVID J. GALVIN, *Primary Examiner.*

JAMES D. KALLAM, *Examiner.*